United States Patent
Kelly (10) Patent No.: US 8,044,699 B1
(45) Date of Patent: Oct. 25, 2011

(54) DIFFERENTIAL HIGH VOLTAGE LEVEL SHIFTER

(75) Inventor: David W. Kelly, Eagan, MN (US)

(73) Assignee: Polar Semiconductor, Inc., Bloomington, MN (US)

( * ) Notice: Subject to any disclaimer, the term of this patent is extended or adjusted under 35 U.S.C. 154(b) by 0 days.

(21) Appl. No.: 12/804,293

(22) Filed: Jul. 19, 2010

(51) Int. Cl.
*H03L 5/00* (2006.01)

(52) U.S. Cl. ........................................ 327/333

(58) Field of Classification Search .................. None
See application file for complete search history.

(56) References Cited

U.S. PATENT DOCUMENTS

| | | | |
|---|---|---|---|
| 5,502,412 A * | 3/1996 | Choi et al. ............. | 327/333 |
| 5,917,359 A | 6/1999 | Fukunaga et al. | |
| 6,326,931 B1 * | 12/2001 | Falk ....................... | 343/757 |
| 6,501,321 B2 * | 12/2002 | Kumagai ............... | 327/333 |
| 6,611,154 B2 | 8/2003 | Grasso et al. | |
| 6,664,822 B2 * | 12/2003 | Watabe .................. | 327/108 |
| 6,809,553 B2 | 10/2004 | Morini et al. | |
| 6,967,518 B2 * | 11/2005 | Giacomini et al. ..... | 327/333 |
| 7,212,033 B2 | 5/2007 | Subramanian et al. | |
| 7,323,912 B2 * | 1/2008 | Nielsen .................. | 327/108 |
| 7,463,071 B2 * | 12/2008 | Ribarich ................ | 327/110 |
| 7,746,148 B2 * | 6/2010 | Hsu ....................... | 327/333 |
| 7,782,115 B2 * | 8/2010 | Ochi ...................... | 327/333 |
| 2008/0315938 A1 * | 12/2008 | Ishikawa et al. ...... | 327/333 |
| 2009/0256617 A1 * | 10/2009 | Ochi ...................... | 327/333 |

FOREIGN PATENT DOCUMENTS

GB    2244400 A    11/1991

OTHER PUBLICATIONS

Davis, Power Design FAQs Frequently Asked Questions: High-Voltage, Two-Phase Gate Driver ICs; Natoinal Semiconductor Corp.; ED Online 10130.
Merello, et al., Using Monolithic High Voltage Gate Drivers; International Rectifier, DT04-4 revA.
FAN7081_F085 High Side Gate Driver; Fairchild Semiconductor; FAN7081_F085 Rev. 1.0.2.

* cited by examiner

*Primary Examiner* — Lincoln Donovan
*Assistant Examiner* — Khareem E Almo
(74) *Attorney, Agent, or Firm* — Kinney & Lange, P.A.

(57) ABSTRACT

A level-shift circuit translates a control signal to a level-shifted output. The level-shift circuit includes a pulse generator circuit for providing Set and Reset pulses based on the control signal and a level-shift circuit for translating the Set and Reset pulses to level-shifted Set and Reset pulses. First and second differential detectors are connected to monitor the level-shifted Set and Reset pulses to provide detection of communicated Set and Reset pulses despite the presence of transients in the level-shift circuit. A gate drive circuit employs the Set and Reset pulses communicated by the differential detectors to generate a gate drive signal.

18 Claims, 3 Drawing Sheets

DIFFERENTIAL HIGH VOLTAGE LEVEL SHIFTER

BACKGROUND

The present invention is related to high-voltage gate drivers, and in particular to high-voltage level translator circuits.

High-voltage gate drivers are commonly employed to drive the gates of power transistors such as metal-oxide-semiconductor field-effect transistors (MOSFETs) and insulated-gate bipolar transistors (IGBTs), which are commonly used as switches to control the supply of power to high-power devices (e.g., three-phase motors used in washing machines, dryers, air conditioner fans and compressors, dishwashers, etc.). A common topology is half-bridge driver circuit having a high-side power switch and a low-side power switch. The high-side power switch and low-side power switch are turned On and Off to provide, respectively, a high-voltage output or a low-voltage output.

The high-side switch in a half-bridge driver circuit requires generation of a gate voltage (i.e., control voltage) that extends from a voltage equal to the negative supply voltage (typically equal to ground) to turn the high-side transistor Off to a voltage higher than the high-side supply voltage to turn the high-side transistor On (e.g., 600 V or more). A high-voltage gate driver circuit must therefore be able to convert or translate a control voltage (e.g., 5 V) to a voltage higher than the high-side supply voltage (e.g., 600 V or more). This voltage translation is typically provided by a voltage level translator circuit.

A typical voltage level translator circuit receives a logic-level control signal indicating whether a power switch should be On or Off. A pulse generation circuit generates separate On and Off pulses in response to the logic-level control signal. The On and Off pulses control the gates of separate high-voltage transistors, each connected in series with resistors located between the high-side supply voltage and ground. The series connection of the respective transistors and resistor are connected between the high-side supply voltage and ground, with the gate of each transistor controlled by the logic-level input signal interface between the logic-level control signals (e.g., 5 V) and the high-side supply voltage (e.g., 600 V or more). In response to the On pulse switching On a respective high-voltage transistor, current is drawn from the high-side supply voltage, creating a voltage drop across the resistor that is detected by complimentary metal-oxide semiconductor (CMOS) logic components. In a typical system, the CMOS logic components are connected to float between the input voltage and ground, such that the difference between the high-side supply voltage and the reference voltage for the CMOS logic components remain less than some threshold value (e.g., 15 V) tolerable by the CMOS components.

A problem common to such voltage level translator circuits is the presence of parasitic capacitance between the drain and source of the high-voltage transistors used to interface between the logic-level input signal and the high-side supply voltage. The parasitic capacitances are charged by the high-side supply voltage through the associated resistors, creating a voltage drop that may be misinterpreted by the CMOS logic components as a change in the control signal, resulting in erroneous control of the power switch. It would therefore be desirable to provide a high-voltage level translator that provides reliable control of a high-voltage gate driver despite the presence of transient signals created by the parasitic capacitance associated with the high-voltage transistors employed by the high-voltage level translator.

SUMMARY

A level-shift circuit translates a control signal to a level-shifted output signal. The level-shift circuit includes a pulse generator circuit, a voltage translation circuit, first and second differential detector circuits, and a gate drive circuit. The pulse generator circuit receives the control signal and generates in response a Set pulse and a Reset pulse. The voltage translation circuit receives the Set and Reset pulses from the pulse generator circuit and generates in response a level-translated Set pulse and a level-translated Reset pulse. The level-translated Set pulse and level-translated Reset pulse are derived from a high-voltage power supply having a voltage greater than the voltage of the Set pulse and the Reset pulse. The first differential detector has a first terminal connected to receive the level shifted Set pulse and a second terminal connected to receive the level-shifted Reset pulse, wherein the first differential detector generates a logic high output when a threshold voltage difference is present between the level-shifted Set pulse and the level-shifted Reset pulse. The second differential detector has a first terminal connected to receive the level-shifted Reset pulse and a second terminal connected to receive the level-shifted voltage Set pulse, wherein the second differential detector generates a logic high output when a threshold voltage difference is present between the level-shifted Reset pulse and the level-shifted Set pulse. The gate drive circuit generates a gate drive signal based on the outputs provided by the first differential detector and the second differential detector.

DETAILED DESCRIPTION

The present invention provides a high-voltage level translator circuit that tolerates transients caused by parasitic capacitance associated with the high-voltage transistors. The high-voltage level translator employs differential detectors to monitor the voltage on both a set and reset control line associated with the high-voltage transistors.

Figure 1:
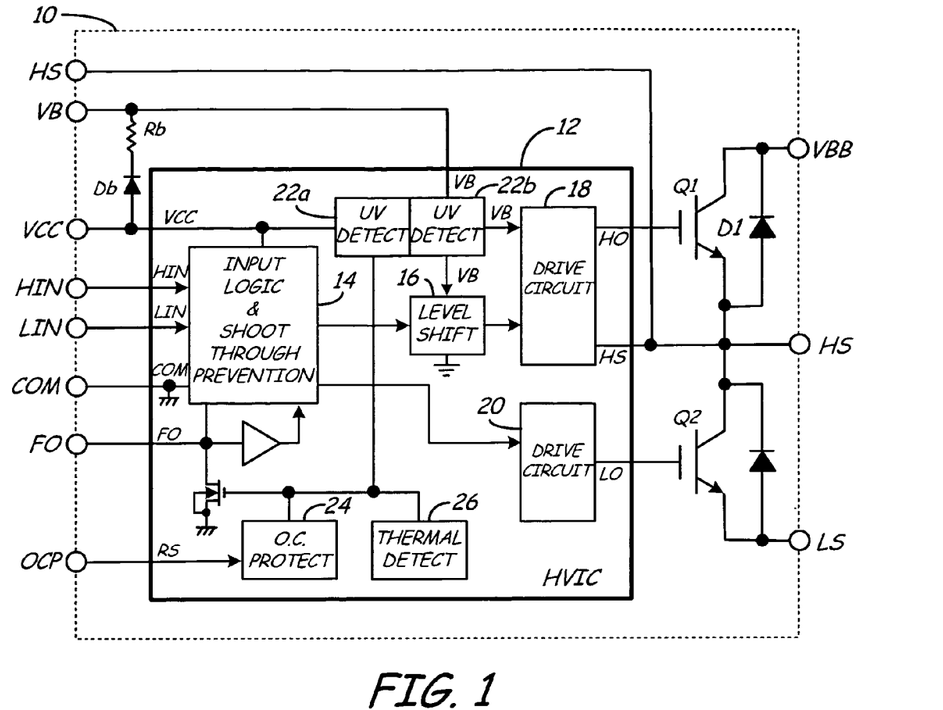
FIG. 1 is a block diagram of a high-voltage half bridge driver according to an embodiment of the present invention.

FIG. 1 is a block diagram of high-voltage half bridge driver 10 according to an embodiment of the present invention. High-voltage half bridge driver 10 includes high-voltage gate driver integrated circuit (HVIC) 12 connected to receive gate driver control signals HIN and LIN and to provide control signals HO and LO to the gate terminals of insulated-gate bipolar transistors (IGBTs) Q1 and Q2, respectively. In other embodiments, other well-known power switching devices may be employed such as power metal-oxide-semiconductor field-effect transistors (MOSFETs). For the sake of simplicity, the term 'power switch' will be used to generically refer to these devices.

Power switch Q1 is connected between high-voltage power input VBB and output terminal HS. When power switch Q1 is On or conducting, high-voltage power provided by power input VBB is supplied across switch Q1 to output terminal HS. When power switch Q1 is Off or non-conducting, power input VBB is prevented from being supplied to output terminal HS. Likewise, power switch Q2 is connected between power input LS (in this example, a ground terminal) and output terminal HS. When power switch Q2 is On or conducting, power provided by input LS is supplied across switch Q2 to output terminal HS. When power switch Q2 is Off or non-conducting, power input LS is prevented from being supplied to output terminal HS. Diodes D1 and D2 are connected between the collector and emitter of power switches Q1 and Q2 respectively, to prevent undesirable power flow from inputs VBB and LS.

HVIC 12 includes input logic and shoot-through prevention circuit 14, level-shift circuit 16, high-side drive circuit 18, low-side drive circuit 20, under-voltage (UV) detection circuits 22a and 22b, over-current protection circuit 24, and thermal detect circuit 26. Under-voltage (UV) detection circuits 22a and 22b detect under-voltage conditions associated with input terminal VCC and high-side voltage supply VB, while over-current protection circuit 24 provides over-current protection for power switches Q1 and Q2. In some embodiments, a resistor is connected between the input terminal LS and ground, and over-current protection circuit 24 is connected to monitor current flowing into the input terminal LS for purposes of detecting high currents flowing through the half-bridge circuit. Input logic and shoot-through protection circuit 14 receives logic-level input signals HIN and LIN from input terminals HIN and LIN. These inputs are provided by another circuit or controller not shown in FIG. 1, and dictate the desired state of power switches Q1 and Q2. In particular, input signal HIN provides a logic high value (e.g., voltage of approximately 3.3-5V) when power switch Q1 is to be turned On, and a logic low value (e.g., voltage of approximately 0 V) when power switch Q1 is to be turned Off. Likewise, input signal LIN provides a logic high value (e.g., voltage of approximately 3.3-5V) when power switch Q2 is to be turned On, and a logic low value (e.g., voltage of approximately 0 V) when power switch Q2 is to be turned Off.

Input logic and shoot through prevention circuit 14 provides a logic-level (e.g., voltage of approximately 5-6V) control signal to level shift circuit 16 and a logic-level control signal (e.g., 5-6V) to low-side drive circuit 20, while providing protection against situations in which both logic-level signals HIN and LIN indicate an On state (i.e., shoot-through condition). In a half-bridge driver such as that shown in FIG. 1, drive circuit 20 typically provides an output logic signal switching having a voltage between the voltage provided at the COM terminal or the LS terminal (e.g., 0 V) and a voltage provided at the voltage at input terminal VCC (e.g., voltage of approximately 12-20V). In contrast, the high voltage associated with power input terminal VBB requires the high-side drive signal HO provided by high-side drive circuit 18 to be a high-voltage signal. Level shift circuit 16 operates to elevate the voltage of the logic-level control signal HIN to the range appropriate for operation of the high-side driver. As discussed in more detail below with respect to FIG. 2, level shift circuit 14 should operate at high speeds, consume little power, and provide clean level translations (i.e., eliminate the effects of noise, transients and dv/dt faults).

In the embodiment shown in FIG. 1, high-side drive circuit 18 is connected to receive a high-voltage input derived from input terminal VCC and level-shifted control signal HIN. In particular, the input terminal VCC is connected through diode Db and resistor Rb to generate bootstrap voltage VB that is provided to high-side drive circuit 18. In addition, power output terminal HS is connected to provide the output low reference to high-side drive circuit 18. As shown in more detail with respect to FIG. 2, output terminal HS provides a reference voltage with respect to bootstrap voltage VB. Because the bootstrap voltage VB floats with respect to the voltage at output terminal HS, high-side drive circuit employs logic-level components (e.g., CMOS logic gates) to provide the desired high-voltage drive signal HO.

Figure 2:
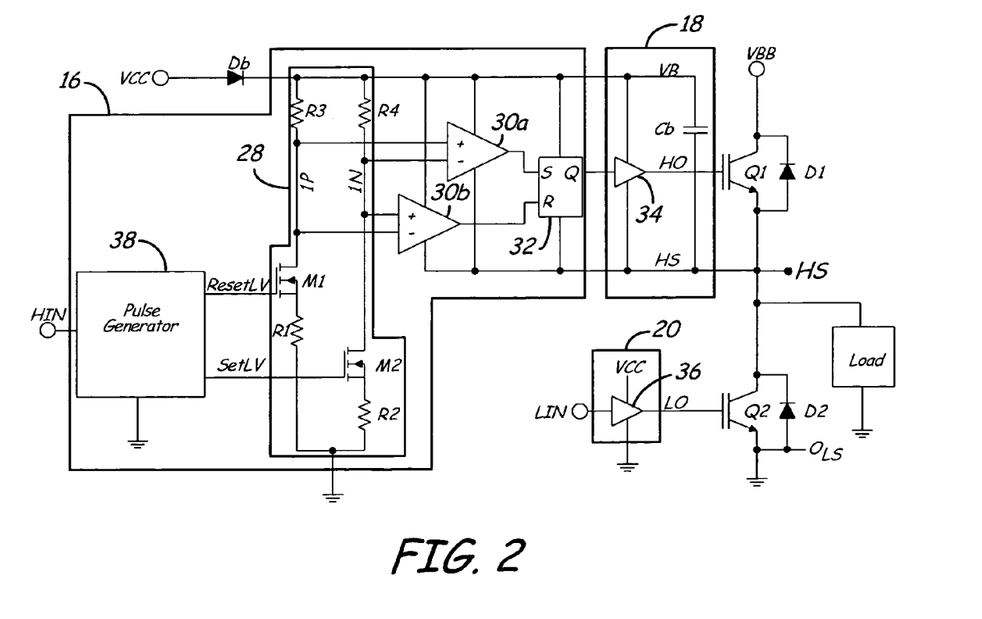
FIG. 2 is a block/circuit level diagram of a high-voltage level translator employed in the high-voltage gate driver circuit according to an embodiment of the present invention.

FIG. 2 is a block/circuit level diagram of level-shift circuit 16 and high-side drive circuit 18 connected to the gate terminal of power switch Q1 and low-side drive circuit 20 connected to the gate terminal of power switch Q2 according to an embodiment of the present invention. Level-shift circuit 16 includes pulse generator 38, voltage translation circuit 28, differential detector circuits 30a and 30b, and set-reset (SR) latch 32. Voltage translation circuit 28 in turn includes high-voltage transistors M1 and M2, and resistors R1, R2, R3 and R4. High-side drive circuit 18 includes first buffer circuit 34 and bootstrap capacitor Cb, while low-side drive circuit includes second buffer circuit 36. In other embodiments, bootstrap capacitor Cb may be a discrete component located external to HVIC 12 between the VB and HS terminals/pins. For the sake of simplicity, low-side control signal LIN and high-side control signal HIN are shown as connected directly to the inputs of level-shift circuit 16, without the intervening presence of input logic and shoot-through prevention circuit 14.

The low-side control signal LIN is provided to second buffer circuit 36, which, depending on the logic level of control signal LIN, provides a drive signal LO equal to either input terminal VCC or ground to the gate terminal of power switch Q2. In contrast, the high-side control signal HIN must be elevated to a voltage level appropriate for high-side drive circuit 18. Depending on the voltage at output terminal HS, the voltage required to turn On power switch Q1 may be substantially higher than the voltage provided by input terminal VCC (as employed by low-side drive circuit 20). To provide the desired gate drive voltage, a bootstrap circuit, including bootstrap capacitor Cb and bootstrap diode Db, supplies a bootstrap voltage VB (i.e., positive input) to the positive power supply of buffer circuit 34 while the output terminal HS is connected to the negative power supply of buffer circuit 34. When power switch Q2 is On, a current path is created between input terminal VCC, through bootstrap diode Db, bootstrap capacitor Cb and power switch Q2 to ground that charges bootstrap capacitor to a voltage near the input terminal voltage VCC. As the voltage at output terminal HS increases, bootstrap capacitor Cb causes the bootstrap voltage Vb to increase. As a result, logic components such as differential detectors 30a, 30b, SR latch 32, and first buffer circuit 34, each of which are connected between the positive and negative rails defined by bootstrap voltage VB and output terminal voltage HS, float between voltage ranges that are acceptable to the logic-level components. For example, when power switch Q1 is On, the voltage at output terminal HS is pulled up to VBB (e.g., 600 V), which causes the bootstrap voltage VB to increase as well (e.g., 614 V). Although the voltages are high, relative to one another the bootstrap voltage VB and output terminal voltage HS provided to power the logic components are within an acceptable range (e.g., 15 V).

In this way, the logic components operate on an island of voltages that remain acceptable relative to one another.

As described above, level-shift circuit 16 must translate the input voltage to a higher voltage appropriate for high-side drive circuit 18. In the embodiment shown in FIG. 2, pulse generator 38 receives as input the high-side control signal HIN, and in response generates reset and set pulses (e.g., ResetLV and SetLV, wherein the label 'LV' designated that these are low-voltage signals) to the gates of high-voltage transistors M1 and M2, respectively. In this embodiment, transistors M1 and M2 are metal-oxide-semiconductor field-effect transistors (MOSFETs) although other high-voltage devices may be employed in alternative embodiments. Pulse generator 38 generates the set pulse SetLV in response to a rising edge of high-side control signal HIN, and the reset pulse ResetLV in response to a falling edge of high-side control signal HIN. The duration of the set and reset pulses need to be of sufficient length to allow detection and latching of the pulses by SR latch 32. Transistors M1 and M2 in combination with resistors R1-R4 of the voltage translation circuit 28 act to translate the logic level signals SetLV and ResetLV provided by pulse generator 38 (i.e., low-voltage signals) to high-voltage signals that can be communicated to high-side drive circuit 18 to drive power switch Q1.

For example, in response to the high-side control signal HIN transitioning to a logic high value, pulse generator 38 generates a set pulse SetLV that is provided to the gate of transistor M2. The set pulse turns On transistor M2, creating a current path from bootstrap voltage VB through resistors R4 and R2 to ground. The resulting voltage drop across resistor R4 decreases the voltage at node 1N while leaving the voltage at node 1P unchanged. As a result, the voltage at the positive terminal of differential detector 30a is greater than the voltage at the negative terminal, creating a voltage differential that results in differential detector 30a generating a logic high signal that sets SR latch 32. In response, SR latch 32 and buffer circuit 34 generate a high-side drive signal HO that turns On transistor Q1 as desired. Conversely, the output of differential detector 30b during this time remains low because the voltage at the positive terminal of the detector (i.e., node 1N) is less than the voltage at the negative terminal of the detector (i.e., node 1P).

When high-side control signal HIN transitions to a logic low value, pulse generator 38 generates a reset pulse ResetLV that is provided to gate of transistor M1. In response, transistor M1 is turned On, creating a current path between bootstrap voltage VB through resistor R3 and R1 to ground. The resulting voltage drop across resistor R3 causes the voltage at node 1P to decrease relative to the voltage at node 1P. As a result, the voltage at the positive terminal of differential detector 30b is greater than the voltage at the negative terminal, creating a voltage differential that results in differential detector 30b generating a logic high signal that resets SR latch 32. In response, SR latch 32 and buffer circuit 34 generate a high-side drive signal 34 that turns Off transistor Q1 as desired. Conversely, the output of differential detector 30a during this time remains low because the voltage at the positive terminal of the detector (i.e., node 1P) is less than the voltage at the negative terminal of the detector (i.e., node 1N).

In this way, level shift circuit 16 employs differential detectors 30a and 30b to detect the set and reset pulses generated by pulse generator 38. In addition, differential detectors 30a and 30b allow the present invention not only to distinguish between control signals and transient events, but to communicate control signals even in the presence of transient events. One source of transients is the parasitic drain-to-source capacitance associated with high-voltage transistors M1 and M2. In instances in which the voltage at the output terminal HS increases, the bootstrap voltage VB similarly increases. The resulting bootstrap voltage VB applied across transistors M1 and M2 when the transistors are Off charges the drain-to-source capacitance of each transistor. Charging of the drain-to-source capacitance results in current flow and resulting voltage drops across resistors R3 and R4. Differential detectors 30a and 30b filter out these common-mode transients by monitoring the translated voltages associated with both the set and reset control signals. For example, a common mode transient may result in a voltage drop across resistors R3 and R4. However, because the voltage drop is across both resistors, the resulting difference between the voltages provided at the positive and negative terminals of each differential detector 30a does not change. In this way, the voltage transient is not communicated by differential detector 30a to SR latch 32.

Another benefit of the present invention is the ability of level translator circuit 16 to communicate control signals during common-mode transient events. For example, assume a set pulse is generated by pulse generator 38 during a common-mode voltage transient. The common-mode transient causes a current to flow through resistors R3 and R4 that results in a corresponding voltage drop across resistors R3 and R4. As provided above, because differential detectors compare the level-shifted voltages associated with nodes 1P and 1N, the differential detectors 30a and 30b are immune to common-mode transients. In this case, however, transistor M2 is turned On such that additional current is allowed to flow through resistor R4, resulting in an additional voltage decrease at node 1N relative to node 1P that is detected by differential detector 30a. In this way, the present invention allows the communication of level-translated signals even during the presence of common-mode-transients.

Figure 3:
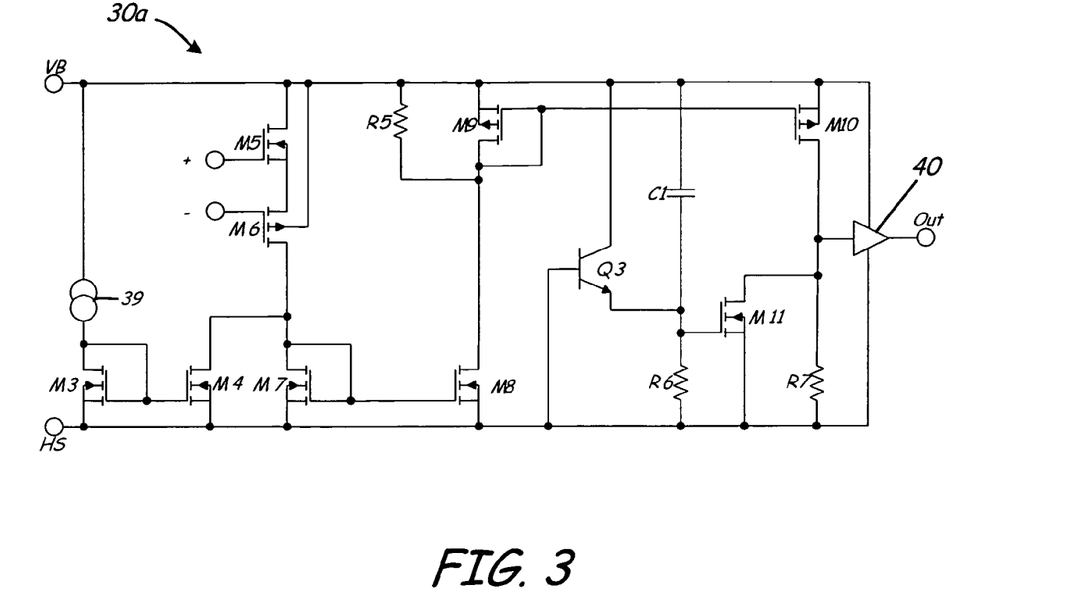
FIG. 3 is a block/circuit level diagram of a differential detector employed in the high-voltage level translator according to an embodiment of the present invention.

FIG. 3 is block/circuit level diagram of differential detector 30a employed in the high-voltage level translator according to an embodiment of the present invention. Differential detector 30a includes MOSFETs M3, M4, M5, M6, M7, M8, M9, M10 and M11, bipolar-junction transistor (BJT) Q3, resistors R5, R6 and R7, capacitor C1, current source 39 and buffer circuit 40. Where appropriate, MOSFETs M3-M11 and BJT Q3 may be replaced by other well-known semiconductor components.

Differential detector 30a includes a positive terminal (+) connected to the gate of transistor M5 and a negative terminal (−) connected to the gate of transistor M6. Transistor M5 is an N-type transistor (NMOS) having a source region connected to bootstrap voltage VB and a drain region connected to the source of transistor M6. In this embodiment, transistor M6 is a P-type transistor (PMOS) having a body referenced to the bootstrap voltage VB and a drain region connected to the current mirror defined by transistors M7 and M8.

If transistors M1 and M2 (as shown in FIG. 2) are both Off, then the inputs provided to the gates of transistors M5 and M6 are substantially equal to one another as well as to bootstrap voltage VB. In response to the voltage at the gate of transistor M6 decreasing below the voltage at the gate of transistor M5, current is caused to flow into the current mirror defined by transistors M7 and M8. For example, in response to transistor M2 (as shown in FIG. 2) being turned On, the voltage at node 1N decreases relative to the voltage at node 1P, thus the voltage at the negative terminal of differential detector 30 decreases relative to the voltage at the positive terminal of differential detector 30. Transistor M6 is turned On and a corresponding current is allowed to flow into current mirror M7 and M8. The combination of the current mirror defined by transistors M3 and M4 and current source 39 define a threshold for the current level produced by transistors M5 and M6 to be mirrored by transistors M7 and M8. This prevents noise and other small variations in the voltage provided at the input of differential detector 30a from being communicated to the output of differential detector 30a. The combination of transistors M5 and M6, along with transistor M7 represents a first amplification stage.

The current mirror defined by transistors M7 and M8 provides a current that is mirrored through the current mirror defined by transistors M9 and M10 to generate a voltage across resistor R7. The combination of transistors M8 and M9 represent a second amplification stage, and the combination of transistor M10 and resistor R7 represents a third amplification stage. The voltage across resistor R7 pulls up the voltage relative to output terminal HS at the input of buffer circuit 40 to generate a logic high value. Buffer circuit 40 receives power from bootstrap voltage VB and output terminal HS. A logic high value results in a voltage equal to the bootstrap voltage VB being supplied at the output of buffer circuit 40, and thus at the output of differential detector 30a. The design of differential detector 30a described with respect to FIG. 3 is exemplary, and persons of ordinary skill in the art could vary the implementation of the differential detector to achieve the same results.

Figure 4:
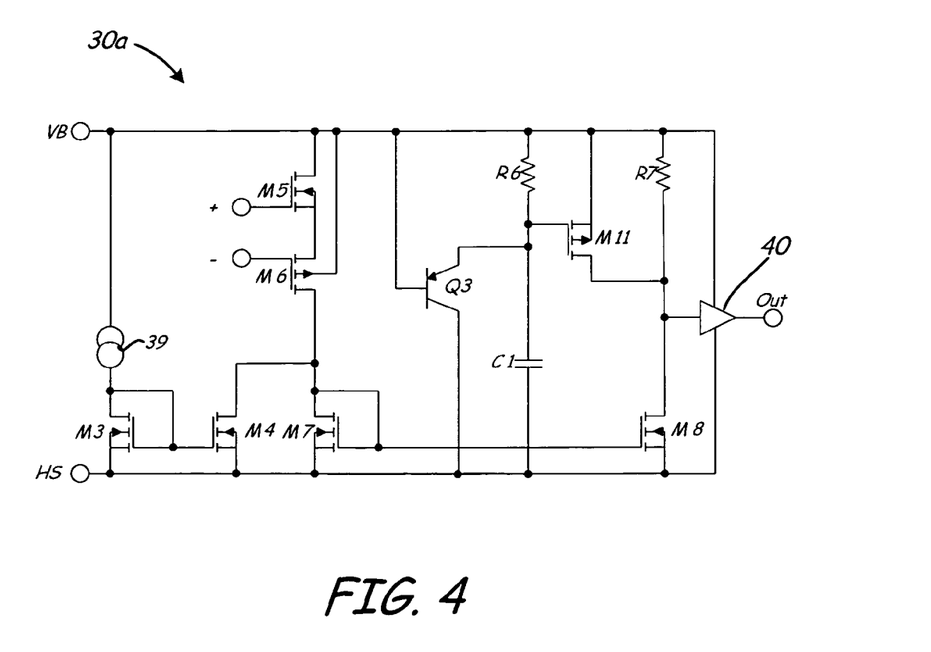
FIG. 4 is a block/circuit level diagram of a differential detector employed in the high-voltage level translator according to another embodiment of the present invention.

For example, FIG. 4 is a block/circuit level diagram of a differential detector 30a employed in the high-voltage level translator according to another embodiment of the present invention. With respect to the design provided in FIG. 3, the current mirror defined by transistors M9 and M10 is removed, and resistor R7 is placed between bootstrap voltage VB and the drain of transistor M8. In this embodiment, rather than pulling up a voltage relative to output terminal HS, the placement of resistor R7 would pull down the voltage relative to bootstrap voltage VB.

In contrast with the embodiment of the differential detector provided in FIG. 3 that employed three amplification stages, the differential detector 30a provided in FIG. 4 includes only two amplification stages. The first stage is defined by the combination of transistors M5, M6 and transistor M7. The second stage is defined by the combination of transistor M8 and resistor R7. Because each stage inverts the logic of the input signal, the embodiment of differential detector 30a provided in FIG. 4 employs an inverting buffer circuit 41 to provide a digital output equivalent to that provided by the differential detector shown in FIG. 3.

Figure 5:
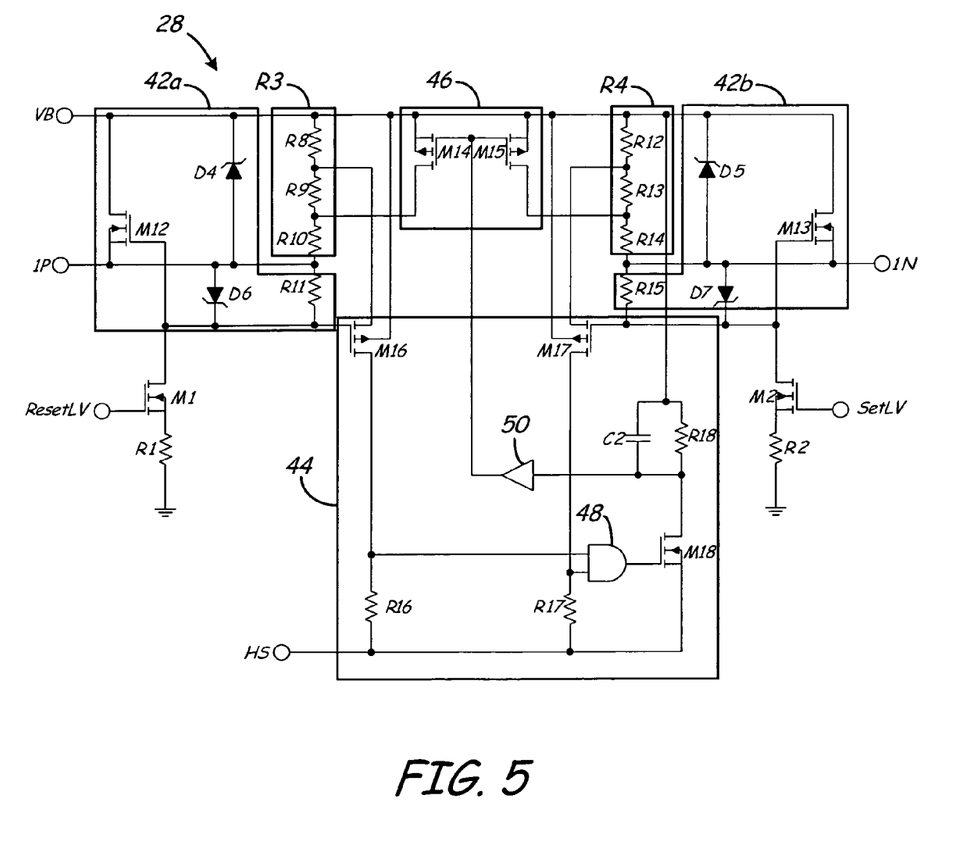
FIG. 5 is a block/circuit level diagram of a voltage clamping and gain adjustment circuit employed in the high-voltage level translator according to another embodiment of the present invention.

FIG. 5 is a block/circuit level diagram of additional circuitry that may be employed as part of voltage translation circuit 28 (shown in FIG. 2) to provide voltage clamping and active gain adjustment that extends operation of the level translator to higher voltage slew rates. With respect to the embodiment shown in FIG. 2, transistors M1 and M2 and resistors R1 and R2 remain the same, while resistors R3 and R4 are replaced with first and second resistor networks comprised of resistors R8-R10 and resistors R12-R14, respectively. Additional circuitry employed in this embodiment includes voltage clamping circuits 42a and 42b, common-mode transient detection circuit 44, and gain reduction circuit 46. Voltage clamping circuits 42a and 42b includes transistors M12 and M13, Zener diodes D4, D5, D6 and D7, and resistors R11 and R15. Common-mode transient detection circuit 44 includes transistors M16-18, resistors R16-R18, logical AND gate 48, capacitor C2, and buffer circuit 50. Gain reduction circuit 46 operates in conjunction with the first and second resistor networks including resistors R8-R10 and resistors R12-R14 and includes transistors M14 and M15.

Set and Reset signals SetLV and ResetLV are once again provided to the respective gates of transistors M2 and M1, and nodes 1P and 1N are connected to the respective inputs of differential detectors 30a and 30b. Voltage clamping circuits 42a and 42b act to maintain the voltage at nodes 1P and 1N, respectively, below the voltage provided by bootstrap voltage VB. Voltage clamping is provided by Zener diodes D4 and D5 connected between bootstrap voltage VB and nodes 1P and 1N, respectively. In particular, Zener diodes D4 and D5 serve to protect the inputs of differential detectors 30a and 30b by limiting the voltage on nodes 1P and 1N relative to bootstrap voltage node VB. That is, Zener diode D4 prevents the voltage at node 1P from decreasing below the bootstrap voltage minus the breakdown voltage of the Zener diode (e.g., VB−6.25 V), and likewise prevents the voltage at node 1P from increasing more than a diode above of the bootstrap voltage node VB (e.g., VB+0.7 V). In response to positive transients on the bootstrap voltage node (i.e., sudden increase in the voltage), Zener diodes D4 and D5 will be reverse biased and will limit the voltage differential between the bootstrap voltage node and nodes 1P and 1N to the Zener diode breakdown voltage. This breakdown of the Zener diodes ensures that the voltages on nodes 1P and 1N are pulled up along with the voltage on the bootstrap voltage node during positive transients. In response to negative transients on the bootstrap voltage node (i.e., sudden decrease in the voltage), Zener diodes D4 and D5 will be forward biased and will limit the voltage differential between the bootstrap voltage node and nodes 1P and 1N to the forward voltage of these diodes. This forward conduction of the Zener diodes ensures that the voltages on nodes 1P and 1N are pulled down along with the voltage on the bootstrap voltage node during negative transients. In this way, the addition of Zener diodes D4 and D5 limits the voltage difference between the bootstrap voltage node and nodes 1P and 1N within a desired range.

However, the addition of Zener diodes D4 and D5 having anodes consisting of heavily doped P+ regions that are isolated from the substrate by a lightly doped N− region and cathodes consisting of heavily doped N+ regions contained within the P+ anode regions has the undesirable effect of creating parasitic diodes at the junction of the P+ anode region and the N− isolation region that is in parallel with the Zener diode created by the P+/N+junction. The parasitic diode (not shown) created by the junction of the P+ anode region and N− isolation region is forward biased at the same time that the Zener diode is forward biased. As described earlier, the parasitic capacitance associated with transistors M1 and M2 may result in transients as the capacitance is charged. In addition, when the voltage on node HS decreases (resulting in the bootstrap voltage VB decreasing), this parasitic capacitance is discharged creating a negative transient that results in the voltage on nodes 1P and 1N being temporarily higher than the voltage on node VB. As a result, Zener diodes D4 and D5 are forward biased, as are the parasitic diodes connected in parallel with each Zener diode. Forward biasing of the parasitic diodes has the undesirable effect of injecting minority carriers into the N− isolation region. To minimize the injection of these minority carriers, transistors M12 and M13 are added to clamp nodes 1P and 1N to the voltage provided at node VB during large negative transients. Zener diodes D6 and D7 and resistors R11 and R15 generate a signal between the gates and sources of transistors M12 and M13, turning those transistors On when an excessive negative transient occurs and preventing the injection of minority carriers into the N− isolation region.

Common-mode transient detection circuit 44 detects the presence of common-mode transients (i.e., filters out communication of level-translated signals) and provides an output to gain reduction circuit 46 that in response to a detected common-mode transient reduces the gain of the level-translation circuit by selectively shorting out select resistors in the first and second resistor network. Selective gain reduction in response to common-mode transients is provided by load resistors R8-R10, R12-R14, transistors M14-M18, and logical AND gate 44. In this embodiment, resistors R3 and R4 (shown in FIG. 2) are replaced by load resistors R8-R10 and R12-R14. In combination with transistors M14 and M15, the effective value of the resistors R3 and R4 can be varied to selectively reduce the gain of the circuit during common-mode transients. During positive transients (e.g., during charging of the parasitic capacitance associated with transistors M1 and M2), transistors M14 and M15 are turned On to create a lower resistance current path and thereby reduce the signal amplitude on nodes 1P and 1N. For example, turning On transistor M14 creates a current path from bootstrap voltage VB through transistor M14, resistor R10 to the parasitic capacitance associated with transistor M1. By removing resistors R8 and R9 from the current path, the voltage drop provided at node 1P is decreased. This has the effect of reducing both the magnitude of the common mode transients as well as the differential gain of the circuit, but the reduction in the differential gain of the circuit is tolerable as the large differential gains are required only for level translator signal transmission when the bootstrap voltage VB is low. Resistors R8-R10 and resistors R12-R14 are selected to provide level translator transmission when bootstrap voltage VB and the voltage at output terminal HS are low, a condition where the drain resistances of transistors M1 and M2 limit current flow. At higher voltages, the drive currents available from transistors M1 and M2 are large enough to allow for much smaller load resistances, so the gain reduction that occurs when transistors M14 and M15 turn On is tolerable.

Detection of common-mode transients for turn-On of transistors M14 and M15 is provided by transistors M16, M17, and M18, logical AND gate 44, and capacitor C2. Transistors M16 and M17 are turned On in response to a voltage drop across load resistors R8-R11 and R12-R15. Logical AND gate 44 turns On in response to both transistors M16 and M17 conducting. In this way, the combination of transistors M16 and M17 with logical AND gate 44 detects common-mode transients, but not the communication of control signals in which a voltage drop exists across either load resistors R8-R11 or load resistors R12-R15. A logical high output from logical AND gate 44 turns On transistor M18, causing capacitor C2 to charge and turn On transistors M14 and M15 for a duration of time (i.e., the time required to charge capacitor C2). Turning On transistors M14 and M15 changes the effective resistance of the load resistors by shorting out resistors R8-R9 and resistors R12-R13, respectively, and thereby providing gain reduction that minimizes the effect of common-mode transients. By turning transistors M14 and M15 on for a short duration of time, the gain of the circuit is restored following the dissipation of the common-mode transient.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A level-shift circuit for translating a control signal to a level-shifted output signal, the level-shift circuit comprising:
   a pulse generator circuit for receiving the control signal and generating in response to the control signal a Set pulse and a Reset pulse;
   a voltage translation circuit connected to receive the Set and Reset pulses from the pulse generator circuit and to generate in response a level-translated Set pulse and a level-translated Reset pulse, wherein the level-translated Set pulse and level-translated Reset pulse are derived from a bootstrap voltage node having a voltage greater than a voltage of the Set pulse and the Reset pulse, wherein the voltage translation circuit includes:
      a first resistor network connected between the bootstrap voltage node and a first node for providing the level-translated Set pulse;
      a second resistor network connected between the bootstrap voltage node and a second node for providing the level-translated Reset pulse;
      a first high-voltage transistor connected between the first resistor network and a reference node and controlled to be On or Off by the Set pulse provided by the pulse generator circuit, wherein when the first high-voltage transistor is On a current path between the bootstrap voltage node and the reference node through the first resistor network provides the level-translated Set pulse;
      a second high-voltage transistor connected between the second resistor network and a reference node and controlled to be On or Off by the Reset pulse provided by the pulse generator circuit, wherein when the second transistor is On a current path between the bootstrap voltage node and the reference node through the second resistor network provides the level-translated Reset pulse;
      a common-mode transient detection circuit connected to monitor voltages across the first and second resistor networks and to provide an output in response to detected common-mode transients; and
      a gain reduction circuit connected to reduce gain associated with translation of the Set and Reset pulses to level-translated Set and Reset pulses in response to a common-mode transient detected by the common-mode transient detection circuit;
   a first differential detector connected to receive the level-translated Set pulse and the level-translated Reset pulse, wherein the first differential detector generates a logic high output when a threshold voltage difference is present between the level-translated Set pulse and the level-translated Reset pulse;
   a second differential detector connected to receive the level-translated Reset pulse and the level-translated Set pulse, wherein the second differential detector generates a logic high output when a threshold voltage difference is present between the level-translated Reset pulse and the level-translated Set pulse; and
   a gate drive circuit for generating a gate drive signal based on the outputs provided by the first differential detector and the second differential detector.

2. The level-shifted circuit of claim 1, wherein the first resistor network is comprised of a first plurality of resistors and the second resistor network is comprised of a second plurality of resistors, the gain reduction circuit further including:
   a third transistor connected between the bootstrap voltage node and at least one resistor in the first plurality of resistors; and a fourth transistor connected between the bootstrap voltage node and at least one resistor in the second plurality of resistors, wherein in response to a common-mode transient detected by the common-mode transient detection circuit, the third and fourth transistors are turned On to reduce the resistance of the first and second resistor networks.

3. The level-shifted circuit of claim 2, wherein the common-mode transient detection circuit includes:
a fifth transistor connected to turn On in response to voltage drops across the first resistor network;
a sixth transistor connected to turn On in response to voltage drops across the second resistor network; and
a logical AND gate connected to turn On in response to both the fifth and sixth transistor turning On in response to voltage drops across both the first and second resistor network, wherein the output of the logical AND gate is provided to turn On the third and fourth transistors in response to a detected common-mode transient.

4. The level-shifted circuit of claim 3, wherein the common-mode transient detection circuit includes:
a timer circuit for maintaining the third and fourth transistors On following a detected common-mode transient for a period of time defined by the timer circuit.

5. The level-shifted circuit of claim 1, further including:
a first voltage clamping circuit connected between the bootstrap voltage node and the node for providing the level-translated Set pulse to limit voltage differences between the level-shifted Set and the bootstrap voltage node; and
a second voltage clamping circuit connected between the bootstrap voltage node and the node for providing the level-translated Reset pulse to limit voltage differences between the level-shifted Reset pulse and the bootstrap voltage node.

6. The level-shifted circuit of claim 5, wherein the first voltage clamping circuit includes a first Zener diode connected between the node for providing the level-translated Set pulse and the bootstrap voltage node and the second voltage clamping circuit includes a second Zener diode connected between the node for providing the level-translated Reset pulse and the bootstrap voltage node.

7. The level-shifted circuit of claim 6,
wherein the first voltage clamping circuit includes:
a third Zener diode connected in parallel with a third resistor between the node for providing the level-translated Set pulse and a drain of the first high-voltage transistor to detect negative transients on the bootstrap voltage node; and
a seventh transistor connected between the bootstrap voltage node and the node for providing the level-translated Set pulse, wherein the seventh transistor is turned On in response to detected negative transients; and
wherein the second voltage clamping circuit includes:
a fourth Zener diode connected in parallel with a fourth resistor between the node for providing the level-translated Reset pulse and a drain of the second high-voltage transistor to detect negative transients on the bootstrap voltage node; and
an eighth transistor connected between the bootstrap voltage node and the node for providing the level-translated Reset pulse, wherein the eighth transistor is turned On in response to detected negative transients.

8. A high-voltage driver circuit for supplying a drive output to a power switch connected to supply a high-voltage power input to an output terminal, the high-voltage driver circuit comprising:
an input terminal for receiving a power supply voltage;
a bootstrap diode connected between the input terminal and a bootstrap voltage;
a capacitor connected between the bootstrap terminal and the output terminal to provide a bootstrap voltage having a magnitude related to a magnitude of the output terminal;
a pulse generator circuit for receiving a low-voltage control signal and generating in response to the control signal a Set pulse and a Reset pulse;
a voltage translation circuit connected to receive the Set and Reset pulses and to provide in response a level-translated Set pulse and a level-translated Reset pulse, wherein the level-translated Set pulse and level-translated Reset pulse are derived from the bootstrap voltage;
a first differential detector connected to receive the level-translated Set pulse and the level-translated Reset pulse, and to provide in response a first output indicating whether a level-translated Set pulse has been detected based on a comparison of the level-translated Set pulse and the level-translated Reset pulse;
a second differential detector connected to receive the level-translated Set pulse and the level-translated Reset pulse, and to provide in response a second output indicating whether a level-translated Reset pulse has been detected based on a comparison of the level-translated Set pulse and the level-translated Reset pulse;
a memory circuit for receiving the first and second outputs from the first and second differential detectors, respectively, and for providing in response a level-shifted control signal; and
a gate drive circuit connected to receive the level-shifted control signal from the memory circuit and for providing in response a drive output to the power switch.

9. The high-voltage driver circuit of claim 8, wherein the voltage translation circuit includes:
a first resistor network connected between the bootstrap voltage and a first node for providing the level-translated Set pulse;
a second resistor network connected between the bootstrap voltage and a second node for providing the level-translated Reset pulse;
a first high-voltage transistor connected between the first resistor network and a reference node and controlled to be On or Off by the Set pulse provided by the pulse generator circuit, wherein when the first high-voltage transistor is On a current path between the bootstrap voltage and the reference node through the first resistor network provides the level-translated Set pulse to the first and second differential detectors;
a second high-voltage transistor connected between the second resistor network and the reference node and controlled to be On or Off by the Reset pulse provided by the pulse generator circuit, wherein when the second transistor is On a current path between the bootstrap voltage and the reference node through the second resistor network provides the level-translated Reset pulse to the first and second differential detectors.

10. The level-shifted circuit of claim 9, wherein the voltage translation circuit further includes:
a common-mode transient detection circuit connected to monitor voltages across the first and second resistor networks and to provide an output in response to detected common-mode transients; and a gain reduction circuit connected to reduce gain associated with translation of the Set and Reset pulses to level-translated Set and Reset pulses in response to a common-mode transient detected by the common-mode transient detection circuit.

11. The level-shifted circuit of claim 10, wherein the first resistor network is comprised of a first plurality of resistors and the second resistor network is comprised of a second plurality of resistors, the gain reduction circuit further including:

a third transistor connected between the bootstrap voltage node and at least one resistor in the first plurality of resistors; and a fourth transistor connected between the bootstrap voltage node and at least one resistor in the second plurality of resistors, wherein in response to a common-mode transient detected by the common-mode transient detection circuit, the third and fourth transistors are turned On to reduce the resistance of the first and second resistor networks.

12. The level-shifted circuit of claim 11, wherein the common-mode transient detection circuit includes:

a fifth transistor connected to turn On in response to voltage drops across the first resistor network;

a sixth transistor connected to turn On in response to voltage drops across the second resistor network; and a logical AND gate connected to turn On in response to both the fifth and sixth transistor turning On in response to voltage drops across both the first and second resistor network, wherein the output of the logical AND gate is provided to turn On the third and fourth transistors in response to a detected common-mode transient.

13. The level-shifted circuit of claim 12, wherein the common-mode transient detection circuit includes:

a timer circuit for maintaining the third and fourth transistors On following a detected common-mode transient for a period of time defined by the timer circuit.

14. The level-shifted circuit of claim 9, further including:

a first voltage clamping circuit connected between the bootstrap voltage and the node for providing the level-shifted Set pulse to limit voltage differences between the node for providing the level-shifted Set pulse and the bootstrap voltage node; and a second voltage clamping circuit connected between the bootstrap voltage node and the node for providing the level-shifted Reset pulse to limit voltage differences between the node for providing the level-shifted Reset pulse and the bootstrap voltage node.

15. The level-shifted circuit of claim 14, wherein the first voltage clamping circuit includes a first Zener diode connected between the node for providing the level-shifted Set pulse and the bootstrap voltage node and the second voltage clamping circuit includes a second Zener diode connected between the node for providing the level-shifted Reset pulse and the bootstrap voltage node.

16. The level-shifted circuit of claim 15, wherein the first voltage clamping circuit includes:

a third Zener diode connected in parallel with a third resistor between the node for providing the level-shifted Set pulse and a drain of the first high-voltage transistor for detecting negative transients on the bootstrap voltage node; and a seventh transistor connected between the bootstrap voltage node and the node for providing the level-shifted Set pulse, wherein the seventh transistor is turned On in response to detected negative transients; and wherein the second voltage clamping circuit includes:

a fourth Zener diode connected in parallel with a fourth resistor between the node for providing the level-shifted Reset pulse and a drain of the second high-voltage transistor to detect negative transients on the bootstrap voltage node; and an eighth transistor connected between the bootstrap voltage node and the node for providing the level-shifted Reset pulse, wherein the eighth transistor is turned On in response to detected negative transients.

17. A level-shift circuit for translating a control signal to a level-shifted output signal, the level-shift circuit comprising:

a pulse generator circuit for receiving the control signal and generating in response to the control signal a Set pulse and a Reset pulse;

a voltage translation circuit connected to receive the Set and Reset pulses from the pulse generator circuit and to generate in response a level-translated Set pulse and a level-translated Reset pulse, wherein the level-translated Set pulse and level-translated Reset pulse are derived from a bootstrap voltage node having a voltage greater than a voltage of the Set pulse and the Reset pulse;

a common-mode transient detection circuit connected to monitor translation of the level-translated Set pulse and the level-translated Reset pulse and to provide an output in response to detected common-mode transients;

a gain reduction circuit connected to reduce gain associated with translation of the Set and Reset pulses by the voltage translation circuit to level-translated Set and Reset pulses in response to a common-mode transient detected by the common-mode transient detection circuit;

a first differential detector connected to receive the level-translated Set pulse and the level-translated Reset pulse, wherein the first differential detector generates a logic high output when a threshold voltage difference is present between the level-translated Set pulse and the level-translated Reset pulse;

a second differential detector connected to receive the level-translated Reset pulse and the level-translated Set pulse, wherein the second differential detector generates a logic high output when a threshold voltage difference is present between the level-translated Reset pulse and the level-translated Set pulse; and a gate drive circuit for generating a gate drive signal based on the outputs provided by the first differential detector and the second differential detector.

18. The level-shifted circuit of claim 17, wherein the voltage translation circuit includes:

a first resistor network connected between the bootstrap voltage node and a first node for providing the level-translated Set pulse, wherein the first resistor network is comprised of a first plurality of resistors;

a second resistor network connected between the bootstrap voltage node and a second node for providing the level-translated Reset pulse, wherein the second resistor network is comprised of a second plurality of resistors;

a first high-voltage transistor connected between the first resistor network and a reference node and controlled to be On or Off by the Set pulse provided by the pulse generator circuit, wherein when the first high-voltage transistor is On a current path between the bootstrap voltage node and the reference node through the first resistor network provides the level-translated Set pulse to the first and second differential detectors;

a second high-voltage transistor connected between the second resistor network and a reference node and controlled to be On or Off by the Reset pulse provided by the pulse generator circuit, wherein when the second transistor is On a current path between the bootstrap voltage node and the reference node through the second resistor network provides the level-translated Reset pulse to the first and second differential detectors;

a third transistor connected between the bootstrap voltage node and at least one resistor in the first plurality of resistors; and a fourth transistor connected between the bootstrap voltage node and at least one resistor in the second plurality of resistors, wherein in response to a common-mode transient detected by the common-mode transient detection circuit, the third and fourth transistors are turned On to reduce the resistance of the first and second resistor networks.

* * * * *